United States Patent
Koyanagi et al.

(10) Patent No.: US 12,082,427 B2
(45) Date of Patent: Sep. 3, 2024

(54) IMAGING DEVICE, METHOD FOR MANUFACTURING IMAGING DEVICE, AND IMAGING APPARATUS

(71) Applicant: Panasonic Intellectual Property Management Co., Ltd., Osaka (JP)

(72) Inventors: Takahiro Koyanagi, Osaka (JP); Yuuko Tomekawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 497 days.

(21) Appl. No.: 17/324,181

(22) Filed: May 19, 2021

(65) Prior Publication Data
US 2021/0273020 A1    Sep. 2, 2021

Related U.S. Application Data

(63) Continuation of application No. PCT/JP2020/004774, filed on Feb. 7, 2020.

(30) Foreign Application Priority Data

Mar. 12, 2019 (JP) ................ 2019-044761

(51) Int. Cl.
*H10K 39/32* (2023.01)
*H10K 30/30* (2023.01)
*H10K 30/82* (2023.01)
*H10K 30/87* (2023.01)

(52) U.S. Cl.
CPC ......... *H10K 39/32* (2023.02); *H10K 30/353* (2023.02); *H10K 30/82* (2023.02); *H10K 30/87* (2023.02)

(58) Field of Classification Search
CPC ..... H01L 27/30; H01L 27/307; H01L 27/146; H01L 29/786; H01L 29/06; H01L 29/66; H01L 29/24; H01L 29/7869; H01L 29/0684; H01L 29/66969; H01L 21/02; H01L 21/477; H01L 21/02554;
(Continued)

(56) References Cited

U.S. PATENT DOCUMENTS

| | | |
|---|---|---|
| 2002/0108649 A1 | 8/2002 | Fujimori et al. |
| 2009/0315136 A1 | 12/2009 | Hayashi |
| 2012/0098079 A1 | 4/2012 | Suzuki |

(Continued)

FOREIGN PATENT DOCUMENTS

| | | |
|---|---|---|
| JP | 3-184381 | 8/1991 |
| JP | 2003-163360 | 6/2003 |

(Continued)

OTHER PUBLICATIONS

International Search Report of PCT application No. PCT/JP2020/004774 dated Apr. 21, 2020.

*Primary Examiner* — Chuong A Luu
(74) *Attorney, Agent, or Firm* — Rimon P.C.

(57) ABSTRACT

An imaging device includes a first electrode, a second electrode, a photoelectric conversion layer that is arranged between the first electrode and the second electrode, and an electron blocking layer that suppresses movement of electrons from the first electrode to the photoelectric conversion layer. The electron blocking layer contains carbon and an oxide of chromium and is arranged between the first electrode and the photoelectric conversion layer.

15 Claims, 6 Drawing Sheets

(58) Field of Classification Search
CPC ........ H10K 30/30; H10K 30/82; H10K 30/87; H10K 30/353; H10K 39/32
USPC ........................................................ 257/431
See application file for complete search history.

(56) References Cited

U.S. PATENT DOCUMENTS

| | | | |
|---|---|---|---|
| 2013/0015435 A1* | 1/2013 | Sawaki | .................. H10K 30/30 257/E51.026 |
| 2014/0070189 A1 | 3/2014 | Leem et al. | |
| 2017/0005126 A1* | 1/2017 | Yamazaki | ....... H01L 31/022475 |
| 2017/0062747 A1 | 3/2017 | Leem et al. | |
| 2018/0294315 A1 | 10/2018 | Shiomi et al. | |

FOREIGN PATENT DOCUMENTS

| | | |
|---|---|---|
| JP | 2009-272528 | 11/2009 |
| JP | 2010-003901 | 1/2010 |
| JP | 2010-114181 | 5/2010 |
| JP | 2011-222949 | 11/2011 |
| JP | 2012-094660 A | 5/2012 |
| JP | 2014-053310 | 3/2014 |
| JP | 2015-153910 | 8/2015 |
| JP | 2017-045987 | 3/2017 |
| WO | 2017/061174 | 4/2017 |

* cited by examiner

IMAGING DEVICE, METHOD FOR MANUFACTURING IMAGING DEVICE, AND IMAGING APPARATUS

BACKGROUND

1. Technical Field

The present disclosure relates to an imaging device, a method for manufacturing an imaging device, and an imaging apparatus.

2. Description of the Related Art

An imaging device includes a first electrode, a second electrode, and a photoelectric conversion layer arranged therebetween. At least one selected from the group consisting of the first electrode and the second electrode is a transparent electrode. The photoelectric conversion layer absorbs incident light and generates electron-hole pairs.

An electron blocking layer may be arranged between the first electrode and the photoelectric conversion layer. The electron blocking layer is a layer that allows holes to pass therethrough and is unlikely to allow electrons to pass therethrough.

International Publication No. WO 2017/061174 describes an imaging device including a buffer layer arranged between a first electrode and a photoelectric conversion layer.

SUMMARY

In one general aspect, the techniques disclosed here feature an imaging device including a first electrode, a second electrode, a photoelectric conversion layer that is arranged between the first electrode and the second electrode and converts light to charge, and an electron blocking layer that suppresses movement of electrons from the first electrode to the photoelectric conversion layer. The electron blocking layer contains carbon and an oxide of chromium and is arranged between the first electrode and the photoelectric conversion layer.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
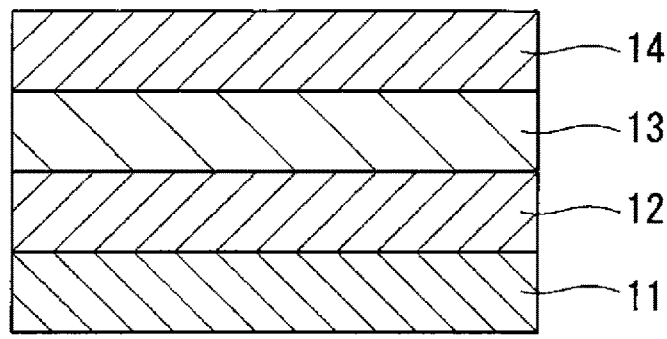
FIG. 1A is a cross-sectional view of an imaging device according to an embodiment of the present disclosure.

Underlying Knowledge Forming Basis of the Present Disclosure

An imaging device is used in, for example, an imaging apparatus such as a CMOS (Complementary Metal Oxide Semiconductor) image sensor. In an imaging apparatus, regardless of the presence or absence of light irradiation to a photoelectric conversion layer, a voltage may be applied to the photoelectric conversion layer. In this case, electrons flow from an electrode to the photoelectric conversion layer, and the S/N ratio (signal to noise ratio) of the sensor decreases.

Summary of an Aspect According to the Present Disclosure

The imaging device according to a first aspect of the present disclosure includes:

a first electrode;

a second electrode;

a photoelectric conversion layer that is arranged between the first electrode and the second electrode and converts light to charge; and an electron blocking layer that suppresses movement of electrons from the first electrode to the photoelectric conversion layer. The electron blocking layer contains carbon and an oxide of chromium and is arranged between the first electrode and the photoelectric conversion layer.

According to the first aspect, an imaging device with a low leakage current in the dark can be provided. The electron blocking layer may include a plurality of layers. The carbon may be contained in the layer containing the oxide of chromium among the plurality of layers.

In a second aspect of the present disclosure, for example, in the imaging device according to the first aspect, the photoelectric conversion layer may contain a photoelectric conversion material, and the photoelectric conversion material may be an organic material. According to the second aspect, the photoelectric conversion layer can be formed by applying a solution containing the photoelectric conversion material directly onto the electron blocking layer.

In a third aspect of the present disclosure, for example, in the imaging device according to the first or second aspect, the photoelectric conversion layer may absorb near-infrared light with a wavelength of 780 to 2000 nm and generate the charge. The imaging device of the third aspect can be used in a sensor that detects near-infrared light.

In a fourth aspect of the present disclosure, for example, in the imaging device according to any one of the first to third aspects, the photoelectric conversion layer may have an absorption peak wavelength within a wavelength range of 780 to 2000 nm. The imaging device of the fourth aspect can be used in a sensor that detects near-infrared light.

In a fifth aspect of the present disclosure, for example, in the imaging apparatus according to any one of the first to fourth aspects, the second electrode, the photoelectric conversion layer, the electron blocking layer, and the first electrode may be arranged in this order such that light enters from the second electrode toward the photoelectric conversion layer. According to this arrangement, the attenuation of incident light in the electron blocking layer can be suppressed.

A manufacturing method according to a sixth aspect of the present disclosure is a method for manufacturing an imaging device, where the imaging device includes a first electrode, a second electrode, a photoelectric conversion layer that is arranged between the first electrode and the second electrode, and an electron blocking layer that is arranged between the first electrode and the photoelectric conversion layer; and the electron blocking layer contains carbon and an oxide of chromium, the manufacturing method including:

forming the electron blocking layer;

preparing an organic solution containing a photoelectric conversion material; and forming the photoelectric conversion layer by applying the organic solution to the electron blocking layer.

According to the sixth aspect, even if the organic solution containing a photoelectric conversion material is directly applied to the electron blocking layer, the electron blocking layer is hardly damaged. The photoelectric conversion layer can be easily formed by application and drying of the organic solution.

In a seventh aspect of the present disclosure, for example, in the method for manufacturing an imaging device according to the sixth aspect, the electron blocking layer may be formed by a metal organic compound decomposition method. According to the seventh aspect, an electron blocking layer containing an oxide of chromium and carbon can be formed with high productivity.

An imaging apparatus according to an eighth aspect of the present disclosure includes:

the imaging device according to any one of the first to fifth aspects;

a charge accumulation area electrically connected to the first electrode or the second electrode; and a charge detection circuit electrically connected to the charge accumulation area.

According to the eighth aspect, since the leakage current in the dark can be decreased, an improvement in image quality, in particular, an improvement in image quality when the amount of light is low can be expected.

In the present disclosure, a circuit, a unit, an apparatus, the whole or a part of members or portions, or the whole or a part of functional blocks in a block diagram can be implemented by, for example, one or a plurality of electron circuits including a semiconductor device, a semiconductor integrated circuit (IC), or an LSI (large scale integration). The LSIs or ICs may be integrated on a single chip, or may be constituted by combining a plurality of chips. For example, functional blocks other than the memory device may be integrated on a single chip. Here, although it is called LSI or IC, the name changes depending on the degree of integration, and those called a system LSI, VLSI (very large scale integration), or ULSI (ultra large scale integration) can also be used. A field programmable gate array (FPGA) which is programed after manufacturing of an LSI or a reconfigurable logic device which can reconstruct the junction relationship inside the LSI or set up the circuit section inside the LSI can also be used for the same purpose.

Furthermore, the functions or operations of a circuit, a unit, an apparatus, or the whole or a part of members or portions can be implemented by software processing. In this case, the software is recorded on one or a plurality of non-temporary recording media, such as an ROM, an optical disc, and a hard disc drive, and when the software is implemented by a processor, a function specified by the software is implemented by the processor and a peripheral unit. A system or apparatus may include one or a plurality of non-temporary recording media in which a software is recorded, a processor, and a required hardware device such as an interface.

Embodiments of the present disclosure will now be described with reference to the drawings. The present disclosure is not limited to the following embodiments.

Embodiment

FIG. 1A shows a cross section of an imaging device 10A according to an embodiment of the present disclosure. The imaging device 10A includes a first electrode 11, an electron blocking layer 12, a photoelectric conversion layer 13, and a second electrode 14. The photoelectric conversion layer 13 is arranged between the first electrode 11 and the second electrode 14. The electron blocking layer 12 is arranged between the first electrode 11 and the photoelectric conversion layer 13. The electron blocking layer 12 is in contact with the first electrode 11 and the photoelectric conversion layer 13. The photoelectric conversion layer 13 is in contact with the electron blocking layer 12 and the second electrode 14. The first electrode 11, the electron blocking layer 12, the photoelectric conversion layer 13, and the second electrode 14 are laminated in this order. The second electrode 14, the photoelectric conversion layer 13, the electron blocking layer 12, and the first electrode 11 are arranged in this order such that light enters from the second electrode 14 toward the photoelectric conversion layer 13. According to this arrangement, the attenuation of incident light in the electron blocking layer 12 can be suppressed.

The imaging device 10A is used, for example, in a part of the pixel of an imaging apparatus. When the imaging device 10A is irradiated with light, electron-hole pairs are generated in the photoelectric conversion layer 13. When a voltage is applied to between the first electrode 11 and the second electrode 14 in such a manner that the potential of the second electrode 14 is higher than the potential of the first electrode 11, holes, which are positive charge, are collected in the first electrode 11, and electrons, which are negative charge, are collected in the second electrode 14. The holes collected in the first electrode 11 or the electrons collected in the second electrode 14 are accumulated in a charge accumulation area (not shown). The electron blocking layer 12 prevents electrons from flowing into the photoelectric conversion layer 13 from the first electrode 11 in the dark. Consequently, the dark current is suppressed, and the S/N ratio, which is the sensitivity of the imaging device 10A, is improved.

The first electrode 11 plays a role of collecting holes generated in the photoelectric conversion layer 13. Examples of the material of the first electrode 11 include a metal, a metal oxide, a metal nitride, and conductive polysilicon. Examples of the metal include aluminum, silver, copper, titanium, and tungsten. A typical example of the metal nitride is TIN. The conductive polysilicon is polysilicon provided with conductivity by addition of impurities.

The first electrode 11 may be a transparent electrode showing transparency to visible light and/or near-infrared light. When the first electrode 11 is arranged on the incident side of light, light passed through the first electrode 11 and the electron blocking layer 12 enters the photoelectric conversion layer 13.

Examples of the material of the transparent electrode include a transparent conductive oxide and a conductive polymer. Examples of the transparent conductive oxide include ITO (Indium Tin Oxide), IZO (Indium Zinc Oxide), AZO (Aluminum-doped Zinc Oxide), FTO (Florine-doped Tin Oxide), $SnO_2$, $TiO_2$, and $ZnO_2$. One or more transparent conductive oxides selected from these oxides can be used as the material of the transparent electrode. Examples of the conductive polymer include PEDOT/PSS (poly(3,4-ethylenedioxythiophene)/poly(4-styrenesulfonate)). A conductive polymer obtained by dispersing, for example, metal particles or particles of a transparent conductive oxide in a polymer material can also be used as a material of the transparent electrode.

In the present specification, the phrase "having transparency" means that the transmittance of light in a specific wavelength range is 60% or more. The wavelength range of visible light is from 400 nm to 780 nm. The wavelength range of near-infrared light is from 780 nm to 2000 nm. The transmittance can be calculated by a method provided in the Japanese Industrial Standards (JIS) R3106 (1998).

The thickness of the first electrode 11 is not particularly limited and is, for example, within a range of 10 to 200 nm.

In the present specification, the "thickness" is the average of those measured at a plurality of points (e.g., arbitrary 5 points). The thickness of a layer at a specific point can be measured by cutting an imaging device 10A in the thickness direction so as to include the specific point to form a cross section and observing the cross section with an electron microscope.

The second electrode 14 is an electrode facing the first electrode 11. The second electrode 14 plays a role of applying a voltage to the photoelectric conversion layer 13 and collecting electrons generated in the photoelectric conversion layer 13. The second electrode 14 has transparency to visible light and/or near-infrared light.

Examples of the material of the second electrode 14 include a transparent conductive oxide and a conductive polymer. Examples of the transparent conductive oxide include ITO, IZO, AZO, FTO, $SnO_2$, $TiO_2$, and $ZnO_2$. One or more transparent conductive oxides selected from these oxides can be used as the material of the second electrode 14. Examples of the conductive polymer include PEDOT/PSS (poly(3,4-ethylenedioxythiophene)/poly(4-styrenesulfonate)). A conductive polymer obtained by dispersing, for example, metal particles or particles of a transparent conductive oxide in a polymer material can also be used as a material of the second electrode 14.

The second electrode 14 may be an opaque electrode not showing transparency to visible light and/or near-infrared light.

Examples of the material of the opaque electrode include a metal, a metal oxide, a metal nitride. and conductive polysilicon. Examples of the metal include aluminum, silver, copper, titanium, and tungsten. A typical example of the metal nitride is TIN. The conductive polysilicon is polysilicon provided with conductivity by addition of impurities.

The thickness of the second electrode 14 is not particularly limited and is, for example, within a range of 10 to 500 nm.

When the imaging device 10A is used in the pixel of an imaging apparatus, the first electrode 11 and the second electrode 14 are called pixel electrode and counter electrode, respectively. The first electrode 11 as the pixel electrode is electrically connected to the charge accumulation area. In the charge accumulation area, for example, holes are accumulated.

Incidentally, the first electrode 11 may be arranged on the incident side of light, and the first electrode 11 may have transparency. In this case, the first electrode 11 is a counter electrode, and the second electrode 14 is a pixel electrode electrically connected to the charge accumulation area. In the charge accumulation area, electrons are accumulated. The type of charge to be accumulated is selected according to the mobility of the carrier in the photoelectric conversion layer 13.

The electron blocking layer 12 prevents electrons from flowing into the photoelectric conversion layer 13 from the first electrode 11 to decrease the dark current. The electron blocking layer 12 includes an oxide of chromium and carbon. A typical example of the oxide of chromium is $Cr_2O_3$. $Cr_2O_3$ is a semiconductor having p-type conductivity. $Cr_2O_3$ has characteristics of transporting holes and preventing transportation of electrons. When the electron blocking layer 12 is constituted of an inorganic material, such as $Cr_2O_3$, restrictions in the manufacturing of the imaging device 10A are decreased. For example, a photoelectric conversion layer 13 can be formed on the electron blocking layer 12 by a coating process using an organic solution.

The phrase "oxide of chromium" means that the electron blocking layer 12 may contain an oxide other than $Cr_2O_3$, for example, chromium(II) oxide, chromium(IV) oxide, or chromium(VI) oxide. The components contained in the electron blocking layer 12 also depend on the method for forming the electron blocking layer 12. For example, when the electron blocking layer 12 is formed using an organic compound containing chromium, the organic compound containing chromium may remain in the electron blocking layer 12. A main component of the electron blocking layer 12 may be $Cr_2O_3$. The term "main component" means the component contained most in the mass ratio.

For example, when the electron blocking layer 12 contains carbon, the crystallization of the electron blocking layer 12 is suppressed, and the electron blocking layer 12 exhibits a polycrystalline or amorphous state. When the crystallization of the electron blocking layer 12 is suppressed to reduce the grain boundary, the transportation of electrons through the grain boundary is suppressed. That is, the dark current caused by crystal defects is suppressed. The carbon concentration in the electron blocking layer 12 is not particularly limited. The carbon concentration in the electron blocking layer 12 is, for example, within a range of 10 atom % or more and 35 atom % or less.

As impurities contained in the electron blocking layer 12, elements other than carbon are also conceivable. However, elements other than carbon have a risk of functioning as a donor or acceptor to the oxide of chromium constituting the electron blocking layer 12 and impairing the ability of the electron blocking layer 12. In addition, elements other than carbon have a risk of diffusing in the photoelectric conversion layer 13 and adversely affecting the characteristics of the photoelectric conversion layer 13.

Since carbon is an element in the same group as oxygen that is one of main constituent elements of the electron blocking layer 12, it does not function as a donor or acceptor. In addition, when the photoelectric conversion layer 13 is made of an organic material, even if carbon diffuses from the electron blocking layer 12 to the photoelectric conversion layer 13, the characteristics of the photoelectric conversion layer 13 are unlikely to be adversely affected.

The electron blocking layer 12 may be constituted of an oxide of chromium and carbon, in other words, may contain an oxide of chromium and carbon only. However, impurities that are inevitably mixed in during the process of manufacturing the imaging device 10A may be contained in the electron blocking layer 12.

The thickness of the electron blocking layer 12 is not particularly limited. The thickness of the electron blocking layer 12 may be 5 nm or more from the viewpoint of sufficiently decreasing the tunneling probability of electrons. The upper limit of the thickness of the electron blocking layer 12 is, for example, 100 nm.

The content (atom %) of carbon in the electron blocking layer 12 can be measured by, for example, X-ray photoelectric spectroscopy (XPS) or secondary ion mass spectrometry (SIMS).

The electron blocking layer 12 has transparency to visible light and/or near-infrared light. Although the electron blocking layer 12 contains carbon, the transparency is maintained. Accordingly, the light incident direction to the photoelectric conversion layer 13 is not limited.

Figure 2:
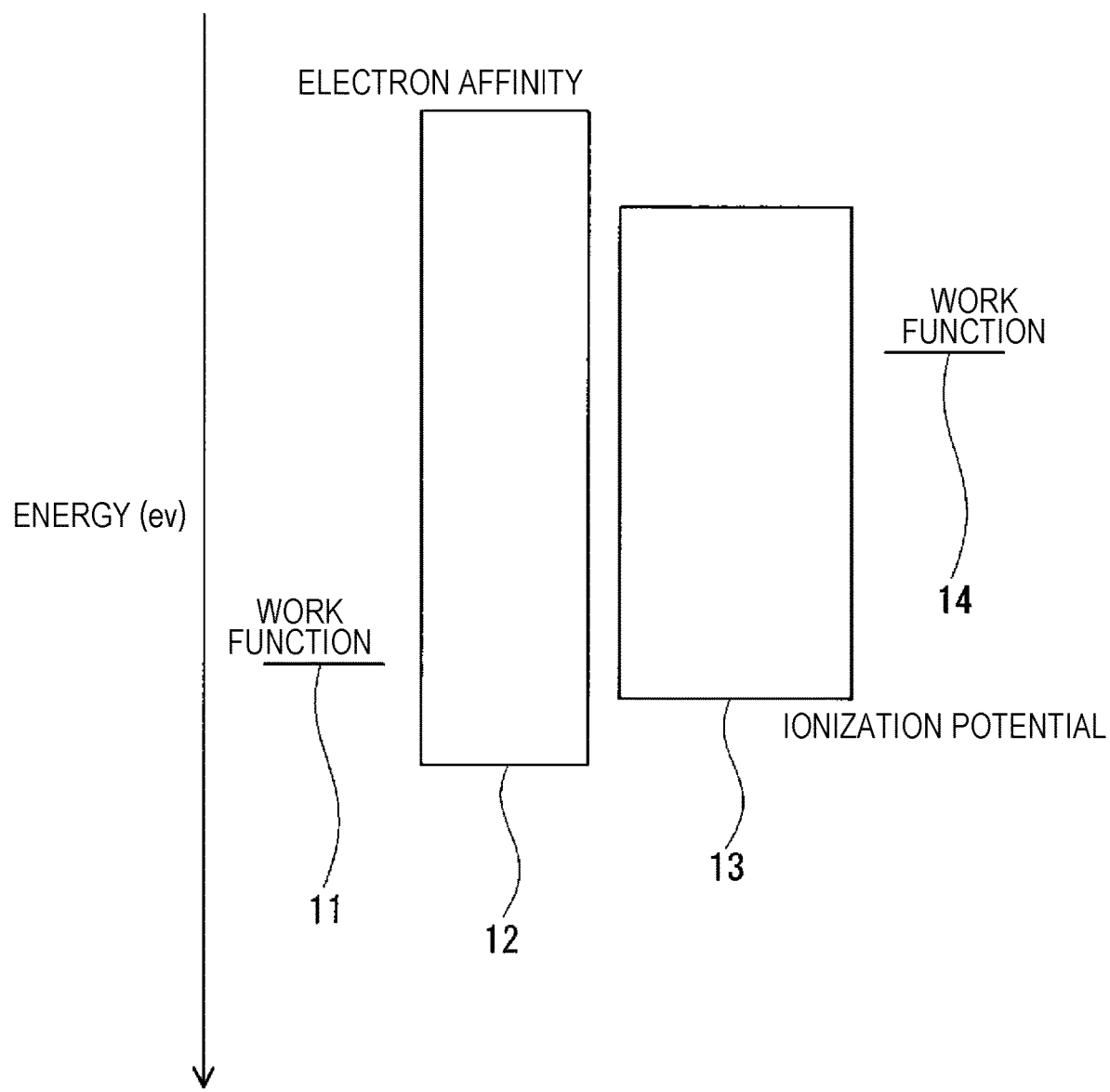
FIG. 2 is an exemplary energy band diagram of the imaging device shown in FIG. 1A.

FIG. 2 shows exemplary energy bands in the imaging device 10A and shows potential of electrons relative to the vacuum level (=0 eV). The upper ends of the energy bands of the electron blocking layer 12 and the photoelectric conversion layer 13 represent electron affinities, and the lower ends represent ionization potentials. The electron affinity of the electron blocking layer 12 is lower than the work function of the first electrode 11. The ionization potential of the electron blocking layer 12 is higher than the ionization potential of the photoelectric conversion layer 13. According to such a relationship, the electron blocking layer 12 prevents the passage of electrons and allows the passage of holes.

The electron affinity and the ionization potential of the electron blocking layer 12 mean the electron affinity and the ionization potential of the main material constituting the electron blocking layer 12, respectively. When the photoelectric conversion layer 13 is a mixed film of a donor and an acceptor, the electron affinity and the ionization potential of the photoelectric conversion layer 13 mean the electron affinity of the acceptor and the ionization potential of the donor, respectively.

The photoelectric conversion layer 13 generates electron-hole pairs in the inside by irradiation with light. The generated electron-hole pairs are separated into electrons and holes by an electric field applied to the photoelectric conversion layer 13, and the electrons and the holes move the first electrode 11 side or the second electrode 14 side, respectively, according to the electric field.

The photoelectric conversion layer 13 can be constituted of a known photoelectric conversion material. The photoelectric conversion material may be an organic material or may be an inorganic material. Examples of the inorganic photoelectric conversion material include hydrogenated amorphous silicon, a compound semiconductor material, and a metal oxide semiconductor material. Examples of the compound semiconductor material include CdSe. Examples of the metal oxide semiconductor material include ZnO.

The photoelectric conversion material can be typically an organic material. When an organic material is used as the photoelectric conversion material, the molecules of the photoelectric conversion material can be relatively freely designed so as to obtain desired photoelectric conversion characteristics. When the photoelectric conversion material is an organic material, a photoelectric conversion layer 13 having excellent flatness can be easily formed by an application process using a solution containing the photoelectric conversion material. In particular, according to the present embodiment, the electron blocking layer 12 is constituted of an inorganic material, and the electron blocking layer 12 is hardly dissolved in the solvent. Accordingly, the photoelectric conversion layer 13 can be formed by applying a solution containing a photoelectric conversion material directly onto the electron blocking layer 12.

When an organic semiconductor material is used as the photoelectric conversion material, the photoelectric conversion layer 13 may be constituted of a laminated film of a donor material and an acceptor material or may be constituted of a mixed film of these materials. The configuration of the laminated film of a donor material and an acceptor material is called a hetero-junction type. The configuration of the mixed film of a donor material and an acceptor material is called a bulk-hetero-junction type.

A p-type semiconductor of an organic compound is a donor-type organic semiconductor and is an organic compound mainly represented by a hole transporting organic compound and having a property of easily donating electrons. For details, when two organic materials are used in contact with each other, an organic material having an ionization potential lower than that of the other is the p-type semiconductor. Accordingly, as the donor-type organic semiconductor, any organic compound having an electron donating property can be used. For example, a metal complex having a ligand of a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (naphthalene derivative, anthracene derivative, phenanthrene derivative, tetracene derivative, pyrene derivative, perylene derivative, or fluoranthene derivative), or a nitrogen-containing heterocyclic compound can be used. The donor-type organic semiconductor is not limited to these compounds, and as described above, an organic compound having an ionization potential lower than that of the organic compound used as an acceptor-type organic semiconductor may be used as the donor-type organic semiconductor.

An n-type semiconductor of an organic compound is an acceptor-type organic semiconductor and is an organic compound mainly represented by an electron transporting organic compound and having a property of easily accepting electrons. For details, when two organic compounds are used in contact with each other, an organic compound having an electron affinity higher than that of the other is the n-type semiconductor. Accordingly, as the acceptor-type organic compound, any organic compound having an electron accepting property can be used. For example, a metal complex having a ligand of fullerene, a fullerene derivative, a fused aromatic carbocyclic compound (naphthalene derivative, anthracene derivative, phenanthrene derivative, tetracene derivative, pyrene derivative, perylene derivative, or fluoranthene derivative), a nitrogen, oxygen, or sulfur-containing 5- to 7-membered heterocyclic compound (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, or tribenzazepine), a polyarylene compound, a fluorene compound, a cyclopentadiene compound, a silyl compound, or a nitrogen-containing heterocyclic compound can be used. The acceptor-type organic semiconductor is not limited to these compounds, and as described above, an organic compound having an electron affinity higher than that of the organic compound used as a donor-type organic compound may be used as the acceptor-type organic semiconductor.

The photoelectric conversion layer 13 may be configured so as to absorb near-infrared light and to perform photoelectric conversion. In this case, the imaging device 10A can be used in a sensor that detects near-infrared light. The photoelectric conversion layer 13 may have an absorption peak wavelength within the wavelength range of near-infrared light. The absorption peak wavelength of the photoelectric conversion layer 13 is, for example, 840 nm or more and may be 940 nm or more or 1400 nm or more. The wavelengths of 840 nm, 940 nm, and 1400 nm are lack wavelengths of sunlight, and an imaging device including a photoelectric conversion layer having an absorption peak wavelength in these wavelengths is unlikely to be affected by sunlight. When such an imaging device is used, it is possible to stably take images under near-infrared light irradiation without being easily affected by sunlight day and night.

The absorption spectrum of the photoelectric conversion layer 13 can be measured using a commercially available spectrophotometer. The wavelength range of measurement is, for example, from 400 nm to 1200 nm. When multiple absorption peaks are present, the wavelength of the peak having a maximum absorption coefficient is regarded as the "absorption peak wavelength".

There is a feature that the molecular weight of an organic photoelectric conversion material that mainly absorbs light in a wavelength range of near-infrared light is larger than the molecular weight of an organic photoelectric conversion material that mainly absorbs light in a wavelength range of visible light. An organic compound having a conjugated double bond is frequently used as an organic photoelectric conversion material, and it is known that the peak wavelength shifts to the longer wavelength side with an increase in the conjugation length. That is, the conjugation length and the molecular weight of an organic photoelectric conversion material that mainly absorbs light in a wavelength range of near-infrared light tend to be larger than those of an organic photoelectric conversion material that mainly absorbs light in a wavelength range of visible light. When a thin film of an organic photoelectric conversion material having a large molecular weight is formed by a vacuum deposition method, the organic photoelectric conversion material tends to be thermally decomposed.

Even if a thin film of an organic photoelectric conversion material could not be formed by a vacuum deposition method, according to the present embodiment, the photoelectric conversion layer 13 can be formed by a coating method by dissolving the organic photoelectric conversion material in an organic solvent.

In the present embodiment, the electron blocking layer 12 is constituted of an inorganic material and is therefore unlikely to be dissolved in an organic solvent. That is, the configuration of the imaging device 10A of the present embodiment is particularly advantageous when the photoelectric conversion layer 13 is constituted of an organic photoelectric conversion material that absorbs light in a wavelength range of near-infrared light.

Figure 3:
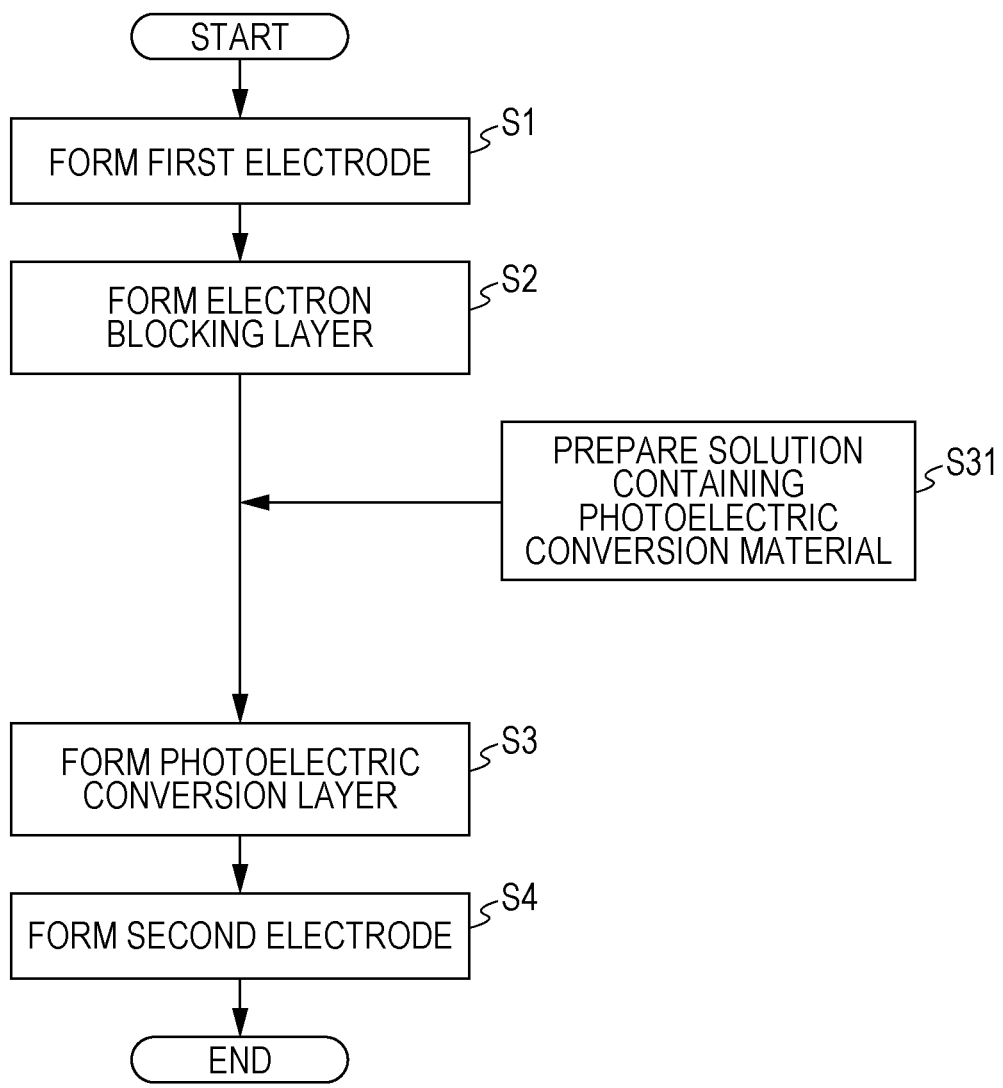
FIG. 3 is a flow chart showing a process of manufacturing the imaging device shown in FIG. 1A.

A method for manufacturing the imaging device 10A will now be described. FIG. 3 shows a process of manufacturing the imaging device 10A.

In step S1, a first electrode 11 is formed. The first electrode 11 may be formed by a vapor phase deposition method, such as a sputtering method, or may be formed by a wet method, such as a plating method. The first electrode 11 may be formed on a substrate 15 (FIG. 1B) described below or a semiconductor substrate.

Subsequently, in step S2, an electron blocking layer 12 is formed on the first electrode 11. The method for forming the electron blocking layer 12 is not particularly limited. The electron blocking layer 12 can be formed by, for example, a wet method. Examples of the wet method include a metal organic compound decomposition method (MOD method). Specifically, a coating film is formed by applying an MOD coating agent, which is a solution containing a metal organic compound, onto the first electrode 11. The coating film is dried and baked at an appropriate temperature to form an electron blocking layer containing an oxide of chromium and carbon with high productivity. The baking conditions of the coating film are, for example, a temperature within a range of 300° C. to 600° C. and for 5 minutes to 1 hour.

Another example of the method for forming the electron blocking layer 12 is a vapor phase deposition method. The vapor phase deposition method can easily control the crystallinity and the carbon concentration of a film and is therefore suitable as a method for forming the electron blocking layer 12. Examples of the vapor phase deposition method include an atomic layer deposition method (ALD method) and a chemical vapor deposition method (CVD method). The ALD method and the CVD method easily control the carbon concentration more precisely and are therefore advantageous. When the electron blocking layer 12 is formed by the ALD method or the CVD method, the carbon concentration in the electron blocking layer 12 can be adjusted by changing the raw materials and the conditions such as the temperature.

When the electron blocking layer 12 is formed by the ALD method or the CVD method, a metal organic compound containing Cr is used as a raw material gas.

According to the present embodiment, since the electron blocking layer 12 is formed before forming a photoelectric conversion layer 13, the electron blocking layer 12 can be formed using various procedures and materials without being restricted by the heat resistance of the organic material constituting the photoelectric conversion layer 13.

Subsequently, in step S3, a photoelectric conversion layer 13 is formed on the electron blocking layer 12. In step S31, an organic solution containing a photoelectric conversion material for constituting the photoelectric conversion layer 13 is prepared in advance. A coating film is formed by applying this organic solution to the electron blocking layer 12, and the coating film is dried to form a photoelectric conversion layer 13. The solvent of the organic solution is not particularly limited as long as it can sufficiently dissolve the photoelectric conversion material.

According to the present embodiment, the electron blocking layer 12 is constituted of an inorganic material. Accordingly, even if an organic solution containing a photoelectric conversion material is directly applied to the electron blocking layer 12, the electron blocking layer 12 is hardly damaged. The photoelectric conversion layer 13 can be easily formed by application and drying of the organic solution.

In step S4, a second electrode 14 is formed on the photoelectric conversion layer 13. The second electrode 14 may be formed by a vapor phase deposition method, such as a sputtering method, or may be formed by a wet method, such as a plating method.

An imaging device 10A is obtained by implementing each of the steps above.

MODIFICATION EXAMPLE

Figure 1B:
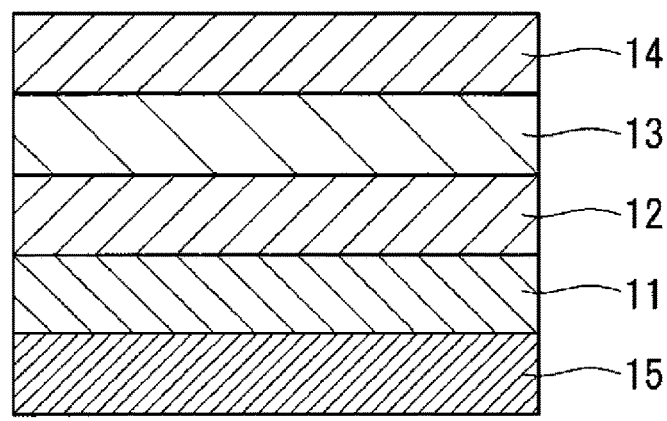
FIG. 1B is a cross-sectional view of an imaging device according to a modification example.
Figure 1C:
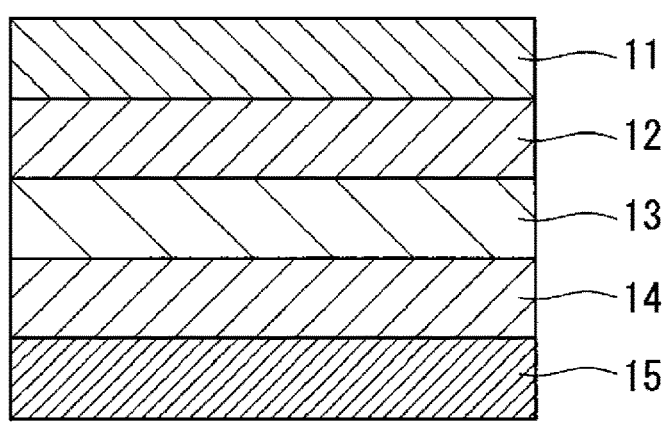
FIG. 1C is a cross-sectional view of an imaging device according to another modification example.

FIGS. 1B and 1C show cross-sections of imaging devices 10B and 10C according to modification examples, respectively. The imaging devices 10B and 10C each further include a substrate 15, in addition to the configuration of the imaging device 10A.

In the imaging device 10B, a first electrode 11 is disposed on a substrate 15. The first electrode 11, an electron blocking layer 12, a photoelectric conversion layer 13, and a second electrode 14 are laminated in this order on the substrate 15.

In the imaging device 10C, a second electrode 14 is disposed on a substrate 15. The second electrode 14, a photoelectric conversion layer 13, an electron blocking layer 12, and a first electrode 11 are laminated in this order on the substrate 15.

The substrate 15 plays a role of supporting or protecting the structure including the first electrode 11, the electron blocking layer 12, the photoelectric conversion layer 13, and the second electrode 14. The material of the substrate 15 is not particularly limited. Examples of the material of the substrate 15 include glass, quartz, a semiconductor, a metal, ceramic, and plastic. The substrate 15 may have transparency to visible light and/or near-infrared light.

In the imaging devices 10A, 10B, and 10C, a hole blocking layer may be disposed between the photoelectric conversion layer 13 and the second electrode 14. The hole blocking layer prevents holes from flowing into the photoelectric conversion layer 13 from the second electrode 14.

The material of the hole blocking layer may be an organic substance or an inorganic substance and may be an organometallic compound. Examples of the organic substance include copper phthalocyanine, PTCDA (3,4,9,10-perylenetetracarboxylic dianhydride), a acetylacetonate complex, BCP, and Alq. Examples of the inorganic substance include MgAg and MgO. The hole blocking layer may have a high transmittance such that the absorption of light by the photoelectric conversion layer 13 is not prevented. The hole blocking layer may have a small thickness. The thickness of the hole blocking layer is, for example, within a range of 2 nm or more and 50 nm or less. As the material of the hole blocking layer, the above-described n-type semiconductor or electron transporting organic compound can also be used.

Imaging Apparatus

Figure 4:
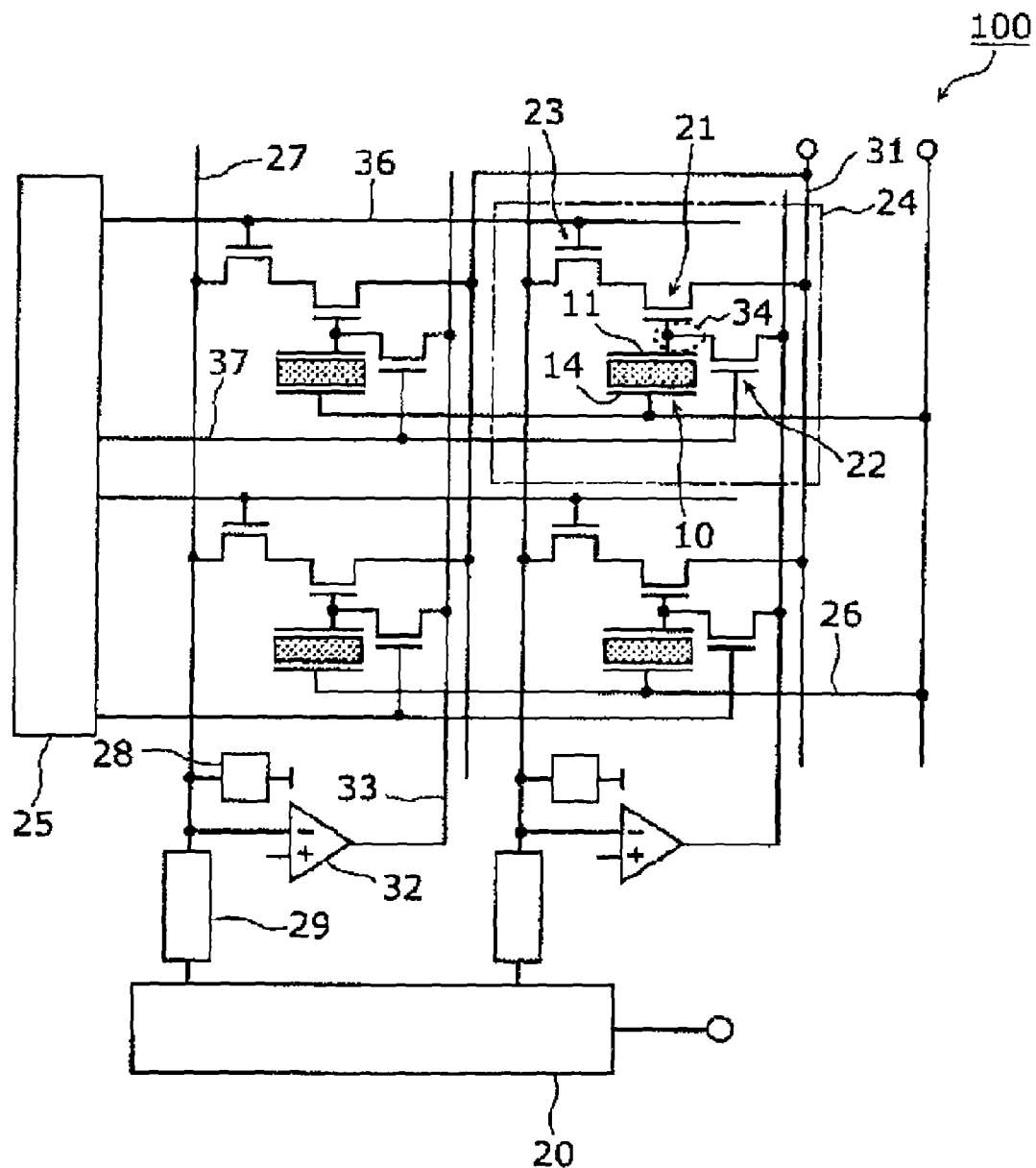
FIG. 4 is a diagram showing an example of a circuit of an imaging apparatus according to an embodiment of the present disclosure.
Figure 5:
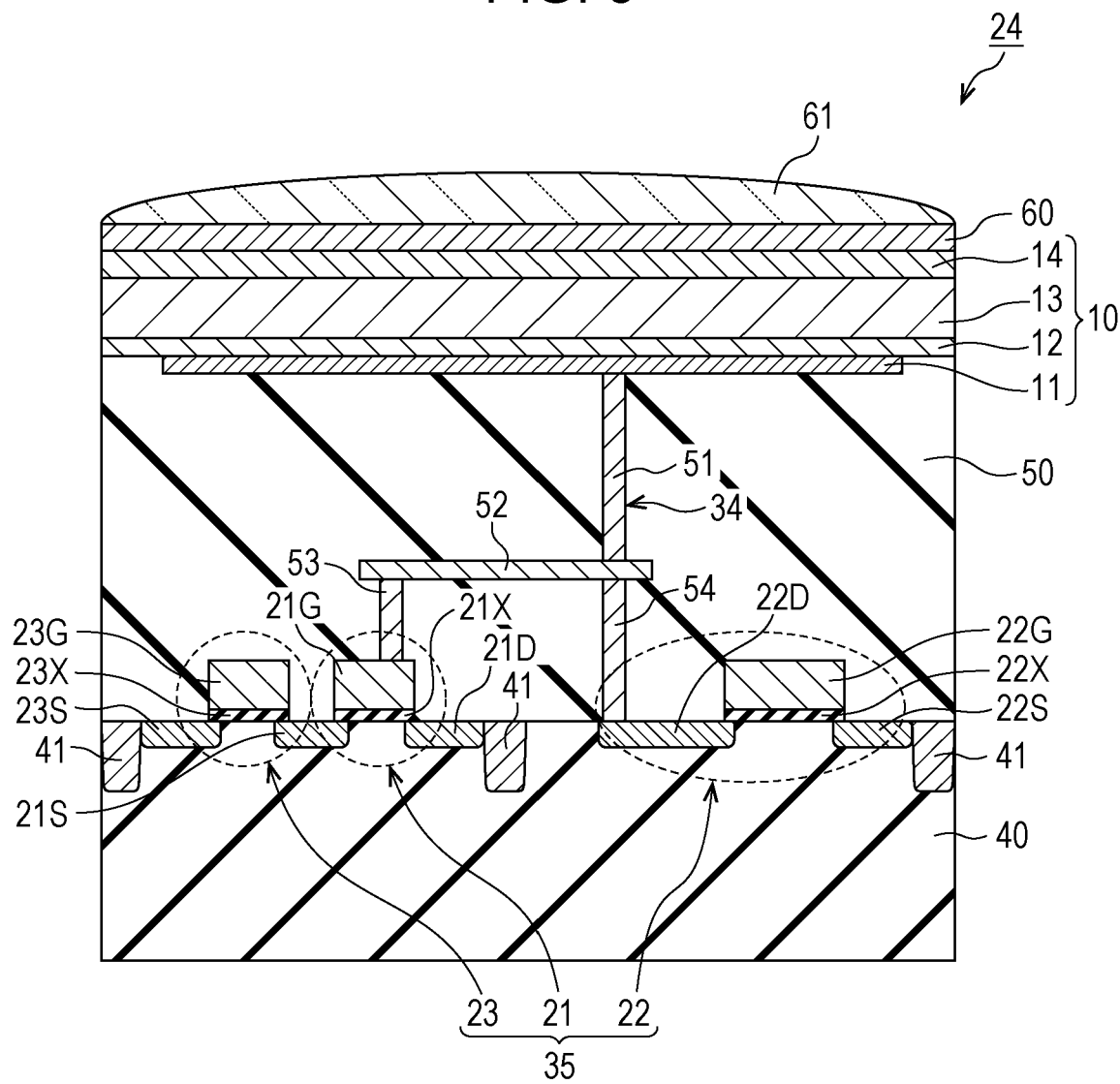
FIG. 5 is a cross-sectional view of a unit pixel in an imaging apparatus according to an embodiment of the present disclosure.

FIG. 4 shows an example the circuit of the imaging apparatus 100 according to an embodiment of the present disclosure. FIG. 5 is a schematic cross-sectional view of a unit pixel 24 in the imaging apparatus 100 according to an embodiment of the present disclosure.

The imaging apparatus 100 according to the present embodiment includes a semiconductor substrate 40 and a unit pixel 24. The unit pixel 24 includes a charge detection circuit 35 disposed on the semiconductor substrate 40, a photoelectric converting portion 10 disposed on the semiconductor substrate 40, and a charge accumulation node 34 electrically connected to the charge detection circuit 35 and to the photoelectric converting portion 10.

As shown in FIG. 4, the imaging apparatus 100 includes a plurality of unit pixels 24 and a peripheral circuit. The imaging apparatus 100 is an organic image sensor that is implemented by a one-chip integrated circuit and includes a pixel array including a plurality of unit pixels 24 two-dimensionally arrayed.

The plurality of unit pixels 24 are arrayed on the semiconductor substrate 40 two-dimensionally, i.e., in the row and column directions, to form a photosensitive area, which is a pixel area. FIG. 4 shows an example in which unit pixels 24 are arrayed in a matrix of two rows by two columns. In FIG. 4, in convenience of illustration, the circuit for individually setting the sensitivity of each unit pixel 24 (e.g., pixel electrode control circuit) is not shown. The imaging apparatus 100 may be a line sensor. In such a case, the plurality of unit pixels 24 may be one-dimensionally arrayed. In the present specification, the row direction and the column direction are the directions in which rows and columns extend, respectively. That is, the vertical direction is the column direction, and the horizontal direction is the row direction.

Each unit pixel 24 includes a charge accumulation node 34 electrically connected to a photoelectric converting portion 10 and a charge detection circuit 35. The charge detection circuit 35 includes an amplification transistor 21, a reset transistor 22, and an address transistor 23.

The photoelectric converting portion 10 includes a first electrode 11 disposed as a pixel electrode, an electron blocking layer 12, a photoelectric conversion layer 13, and a second electrode 14 disposed as a counter electrode. The second electrode 14 is applied with a predetermined voltage through a counter electrode signal line 26.

The first electrode 11 is connected to the gate electrode 21G of the amplification transistor 21. The signal charge collected by the first electrode 11 is accumulated in the charge accumulation node 34 located between the first electrode 11 and the gate electrode 21G of the amplification transistor 21. In the present embodiment, the signal charge is holes, but the signal charge may be electrons.

The signal charge accumulated in the charge accumulation node 34 is applied to the gate electrode 21G of the amplification transistor 21 as a voltage according to the amount of the signal charge. This voltage is amplified by the amplification transistor 21 and is selectively read out by the address transistor 23 as a signal voltage. The reset transistor 22 is connected to the first electrode 11 with its source electrode or drain electrode and resets the signal charge accumulated in the charge accumulation node 34. In other words, the reset transistor 22 resets the potentials of the gate electrode 21G of the amplification transistor 21 and the first electrode 11.

In order that the plurality of unit pixels 24 selectively perform the above-described operation, the imaging apparatus 100 includes power supply wiring 31, a vertical signal line 27, an address signal line 36, and a reset signal line 37. These lines are connected to each unit pixel 24. Specifically, the power supply wiring 31 is connected to the source electrode or the drain electrode of the amplification transistor 21. The vertical signal line 27 is connected to the source electrode or the drain electrode of the address transistor 23. The address signal line 36 is connected to the gate electrode 23G of the address transistor 23. The reset signal line 37 is connected to the gate electrode 22G of the reset transistor 22.

The peripheral circuit includes a vertical scanning circuit 25, a horizontal signal reading circuit 20, a plurality of column signal processing circuits 29, a plurality of load circuits 28, and a plurality of differential amplifiers 32. The vertical scanning circuit 25 is also referred to as a row scanning circuit. The horizontal signal reading circuit 20 is also referred to as a column scanning circuit. The column signal processing circuit 29 is also referred to as a row signal storage circuit. The differential amplifier 32 is also referred to as a feedback amplifier.

The vertical scanning circuit 25 is connected to the address signal line 36 and the reset signal line 37, selects a plurality of unit pixels 24 arranged in each of the rows, row by row, and performs reading of the signal voltage and resetting of the potential of the first electrode 11. The power supply wiring 31, which is a source follower power supply, supplies a predetermined power supply voltage to each unit pixel 24. The horizontal signal reading circuit 20 is electrically connected to the plurality of column signal processing circuits 29. The column signal processing circuits 29 are electrically connected to the unit pixels 24 arranged in each column through the vertical signal line 27 corresponding to each column. The load circuit 28 is electrically connected to each vertical signal line 27. The load circuit 28 and the amplification transistor 21 form a source follower circuit.

The plurality of differential amplifiers 32 are disposed so as to correspond to the respective columns. The input terminal on the negative side of the differential amplifier 32 is connected to the corresponding vertical signal line 27. The output terminal of the differential amplifier 32 is connected to the unit pixels 24 through a feedback line 33 corresponding to each column.

The vertical scanning circuit 25 applies a row selection signal that controls ON and OFF of the address transistor 23 to the gate electrode 23G of the address transistor 23 by the address signal line 36. Consequently, the row of the reading target is scanned and selected. A signal voltage is read out from the unit pixels 24 of the selected row into the vertical signal line 27. The vertical scanning circuit 25 applies a reset signal that controls ON and OFF of the reset transistor 22 to the gate electrode 22G of the reset transistor 22 through the reset signal line 37. Consequently, the row of the unit pixels 24 as a target of the reset operation is selected. The vertical signal line 27 transmits the signal voltage read out from the unit pixels 24 selected by the vertical scanning circuit 25 to the column signal processing circuit 29.

The column signal processing circuit 29 performs noise suppression signal processing represented by correlated double sampling, analog-digital conversion (AD conversion), and so on.

The horizontal signal reading circuit 20 sequentially reads out signals from a plurality of column signal processing circuits 29 into a horizontal common signal line (not shown).

The differential amplifier 32 is connected to the drain electrode of the reset transistor 22 through the feedback line 33. Accordingly, the differential amplifier 32 receives the output value of the address transistor 23 at the negative terminal when the address transistor 23 and the reset transistor 22 are in a conduction state. The differential amplifier 32 performs feedback operation such that the gate potential of the amplification transistor 21 becomes a predetermined feedback voltage. On this occasion, the output voltage value of the differential amplifier 32 is a positive voltage of 0 V or near 0 V. The feedback voltage means the output voltage of the differential amplifier 32.

As shown in FIG. 5, the unit pixel 24 includes a semiconductor substrate 40, a charge detection circuit 35, a photoelectric converting portion 10, and a charge accumulation node 34.

The semiconductor substrate 40 may be, for example, an insulating substrate provided with a semiconductor layer on the surface on the side where a photosensitive area is formed and is, for example, a p-type silicon substrate. The semiconductor substrate 40 includes impurity areas (here, n-type areas) 21D, 21S, 22D, 22S, and 23S and device isolation areas 41 for electrical separation between unit pixels 24. Here, the device isolation area 41 is also disposed between the impurity area 21D and the impurity area 22D. Consequently, the signal charge accumulated in the charge accumulation node 34 is suppressed from leaking. Incidentally, the device isolation area 41 is formed by, for example, ion implantation of an acceptor under a predetermined implantation condition.

The impurity areas 21D, 21S, 22D, 22S, and 23S are typically diffusion layers formed in the semiconductor substrate 40. As shown in FIG. 5, the amplification transistor 21 includes the impurity area 21S, the impurity area 21D, and the gate electrode 21G. The impurity area 21S and the impurity area 21D function as, for example, a source area and a drain area of the amplification transistor 21, respectively. A channel area of the amplification transistor 21 is formed between the impurity area 21S and the impurity area 21D.

Similarly, the address transistor 23 includes the impurity area 23S, the impurity area 21S, and the gate electrode 23G connected to the address signal line 36. In this example, the amplification transistor 21 and the address transistor 23 are electrically connected to each by sharing the impurity area 21S. The impurity area 23S functions as, for example, a source area of the address transistor 23. The impurity area 23S has connection with the vertical signal line 27 shown in FIG. 4.

The reset transistor 22 includes the impurity area 22D, the impurity area 22S, and the gate electrode 22G connected to the reset signal line 37. The impurity area 22S functions as, for example, a source area of the reset transistor 22. The impurity area 22S has connection with the reset signal line 37 shown in FIG. 4.

An interlayer insulation layer 50 is laminated on the semiconductor substrate 40 so as to cover the amplification transistor 21, the address transistor 23, and the reset transistor 22.

In the interlayer insulation layer 50, a wiring layer (not shown) can be arranged. The wiring layer is typically formed from a metal, such as copper and can include, for example, wiring such as the above-described vertical signal line 27 as a part thereof. The number of the insulation layers in the interlayer insulation layer 50 and the number of layers included in the wiring layer arranged in the interlayer insulation layer 50 can be arbitrarily set.

In the interlayer insulation layer 50, a contact plug 54 connected to the impurity area 22D of the reset transistor 22, a contact plug 53 connected to the gate electrode 21G of the amplification transistor 21, a contact plug 51 connected to the first electrode 11, and wiring 52 connecting the contact plug 51, the contact plug 54, and the contact plug 53 to each other are arranged. Consequently, the impurity area 22D of the reset transistor 22 is electrically connected to the gate electrode 21G of the amplification transistor 21.

The charge detection circuit 35 detects the signal charge captured by the first electrode 11 and outputs a signal voltage. The charge detection circuit 35 includes the amplification transistor 21, the reset transistor 22, and the address transistor 23 and forms a semiconductor substrate 40.

The amplification transistor 21 is formed in the semiconductor substrate 40. The amplification transistor 21 includes an impurity area 21D functioning as the drain electrode, an impurity area 21S functioning as the gate electrode, a gate insulation layer 21X formed on the semiconductor substrate 40, and a gate electrode 21G formed on the gate insulation layer 21X.

The reset transistor 22 is formed in the semiconductor substrate 40. The reset transistor 22 includes an impurity area 22D functioning as the drain electrode, an impurity area 22S functioning as the gate electrode, a gate insulation layer 22X formed on the semiconductor substrate 40, and a gate electrode 22G formed on the gate insulation layer 22X.

The address transistor 23 is formed in the semiconductor substrate 40. The address transistor 23 includes an impurity area 21S functioning as the drain electrode, an impurity area 23S functioning as the gate electrode, a gate insulation layer 23X formed on the semiconductor substrate 40, and a gate electrode 23G formed on the gate insulation layer 23X. The impurity area 21S is shared by the amplification transistor 21 and the address transistor 23, and consequently, the amplification transistor 21 and the address transistor 23 are connected in series.

A photoelectric converting portion 10 is arranged on the interlayer insulation layer 50. In other words, in the present embodiment, a plurality of unit pixels 24 constituting a pixel array is formed on the semiconductor substrate 40. The plurality of unit pixels 24 two-dimensionally arrayed on the semiconductor substrate 40 form a photosensitive area. The distance between two adjacent unit pixels 24 (pixel pitch) may be, for example, about 2 μm.

The photoelectric converting portion 10 includes the imaging device 10A described with reference to FIG. 1A. According to the imaging device 10A, since the leakage current in the dark can be decreased, an improvement in image quality, in particular, an improvement in image quality when the amount of light is low can be expected. There is also a possibility of increasing the dynamic range of the imaging apparatus 100.

The charge accumulation node 34 constitutes a charge accumulation area that is electrically connected to the first electrode 11 of the imaging device 10A. Instead of the first electrode 11, the second electrode 14 may be connected to the charge accumulation node 34.

A color filter 60 is disposed in the upper part of the photoelectric converting portion 10. A microlens 61 is disposed in the upper part of the color filter 60. The color filter 60 is formed, for example, as an on-chip color filter by patterning, and a photosensitive resin in which a dye or a pigment is dispersed is used for instance. The microlens 61 is disposed, for example, as an on-chip microlens, and an ultraviolet ray sensitive material is used for instance.

The imaging apparatus 100 can be manufactured using a general semiconductor manufacturing process. In particular, when a silicon substrate is used as the semiconductor substrate 40, the imaging apparatus 100 can be manufactured by utilizing various silicon semiconductor processes.

From the above, according to the present embodiment, an imaging device and an imaging apparatus that have high optical absorption characteristics in a wavelength range of near-infrared light and exhibit a high photoelectric conversion efficiency can be obtained.

EXAMPLES

Example

An ITO electrode was formed as a first electrode on a glass substrate having a thickness of 0.7 mm. The ITO electrode had a thickness of 150 nm.

Subsequently, a chromium oxide thin film was formed as an electron blocking layer on the ITO electrode by the following method. Specifically, an MOD coating agent (manufactured by Kojundo Chemical Lab. Co., Ltd., P/No. Cr-005) was dropped on the ITO electrode, and the substrate was rotated at a rotation speed of 3000 rpm for 30 seconds. Consequently, a thin film of the MOD coating agent was formed on the ITO electrode. The thin film of the MOD coating agent was heated in the air of 120° C. for 10 minutes and was then further baked in a nitrogen atmosphere of 400° C. for 30 minutes. Consequently, a chromium oxide thin film was formed as an electron blocking layer on the ITO electrode. The chromium oxide thin film had a thickness of 15 nm.

Subsequently, a mixed film of $Sn(OSiHex_3)_2Nc$ and $C_{60}$ was formed as a photoelectric conversion layer. Specifically, a mixed film was formed by a vacuum deposition method such that $Sn(OSiHex_3)_2Nc$ and $C_{60}$ were included in the mixed film at a volume ratio of 1:9. The mixed film had a thickness of 400 nm.

An Al thin film was formed as a second electrode on the photoelectric conversion layer by a vacuum deposition method. The Al thin film had a thickness of 80 nm. Through the process above, an imaging device of sample 1 was produced.

Instead of the first electrode, the second electrode may be an electrode having transparency. Both the first electrode and the second electrode may be electrodes having transparency.

Reference Example

By the same method as in Example, a chromium oxide thin film having a thickness of 15 nm was formed on a Si wafer. Consequently, a sample for chromium oxide thin film analysis was obtained.

Comparative Example

An imaging device of Comparative Example was produced by the same method as in Example except that the electron blocking layer was not formed. Leakage current characteristics in the dark The leakage currents of the imaging devices of Example and Comparative Example were measured by the following method. The imaging devices were placed in an environment shielded from light, and measurement terminals of a semiconductor parameter analyzer (manufactured by Keysight Technologies, B1500A) were connected to the first electrode and the second electrode, respectively. A voltage of 0 V was applied to the first electrode. The current values were measured by sweeping the applied voltage to the second electrode from 10 V to 20 V. The results are shown in FIG. 6.

Figure 6:
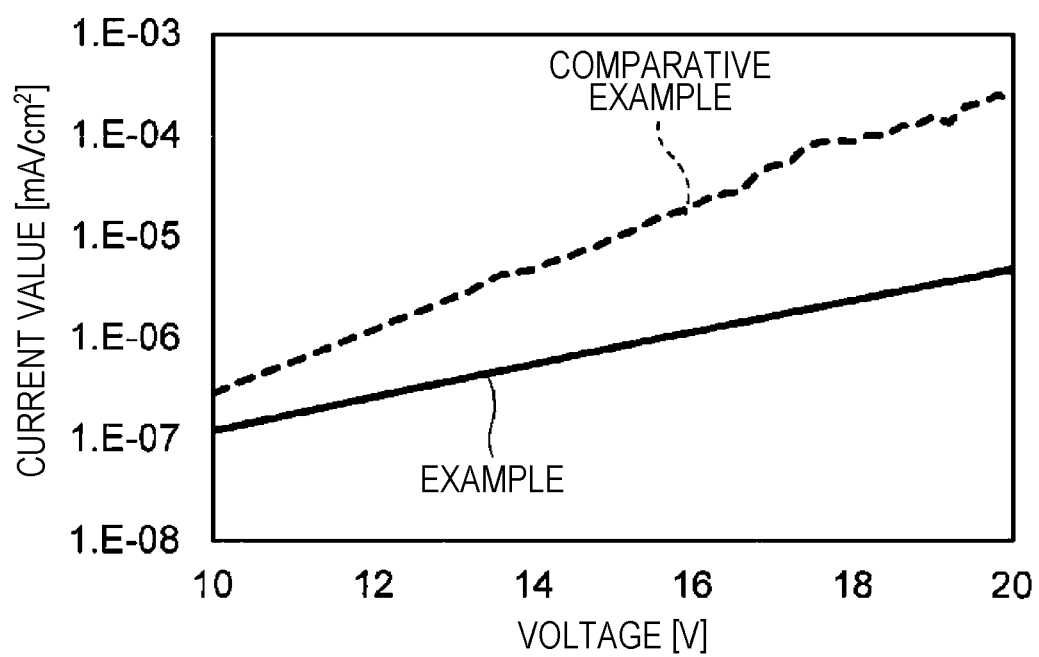
FIG. 6 is a graph showing a relationship between the applied voltage to the second electrode and the detected current value.

FIG. 6 shows a relationship between the applied voltage to the second electrode and the detected current value. The current value in Comparative Example when 10 V was applied was $2.8 \times 10^{-7}$ mA/cm$^2$. The current value in Example when 10 V was applied was $1.2 \times 10^{-7}$ mA/cm$^2$. When 10 V was applied, the current value in Example was drastically lower than that in Comparative Example. When the applied voltage was increased to 20 V, the difference between the current value in Comparative Example and the current value in Example was further increased.

The electron blocking layer forms an energy barrier by having an electron affinity lower than that of the photoelectric conversion material contained in the photoelectric conversion layer and suppresses implantation of electrons from the first electrode to the photoelectric conversion layer. The electron affinity of $Sn(OSiHex_3)_2Nc$, which a p-type semiconductor constituting the photoelectric conversion layer, was 4.0 eV. The electron affinity of chromium oxide constituting the electron blocking layer was 2.4 eV. It was inferred that since an energy barrier of 1.6 eV was formed between the electron affinity of the electron blocking layer and the electron affinity of the photoelectric conversion layer, the implantation of electrons from the first electrode to the photoelectric conversion layer was suppressed by the electron blocking layer, and the leakage current was decreased.

The composition ratio of the chromium oxide thin film in Reference Example was measured by an X-ray photoelectric spectroscopy. The composition ratio was Cr:O:C:N=0.23:0.42:0.34:0.01. The chromium oxide thin film contained a sufficient amount of carbon. It is inferred that carbon inhibits the crystallization of the electron blocking layer and suppresses the generation of crystal defects which causes a leakage current.

The techniques disclosed in the present specification are useful for an imaging device, in particular, an imaging device including a photoelectric conversion layer that has high optical absorption characteristics in a wavelength range of near-infrared light. The imaging device can be applied to an imaging apparatus, an optical sensor, etc.

What is claimed is:

1. An imaging device comprising:
a first electrode;
a second electrode;
a photoelectric conversion layer that is arranged between the first electrode and the second electrode and converts light to charge; and
an electron blocking layer that suppresses movement of electrons from the first electrode to the photoelectric conversion layer,
wherein the electron blocking layer is a chromium oxide layer containing carbon and is arranged between the first electrode and the photoelectric conversion layer.

2. The imaging device according to claim 1, wherein;
the photoelectric conversion layer contains a photoelectric conversion material, and
the photoelectric conversion material is an organic material.

3. The imaging device according to claim 1, wherein the photoelectric conversion layer absorbs near-infrared light with a wavelength of 780 to 2000 nm and generates the charge.

4. The imaging device according to claim 1, wherein the photoelectric conversion layer has an absorption peak wavelength within a wavelength range of 780 to 2000 nm.

5. The imaging device according to claim 1, wherein the second electrode, the photoelectric conversion layer, the electron blocking layer, and the first electrode are arranged in this order such that light enters from the second electrode toward the photoelectric conversion layer.

6. An imaging apparatus comprising:
the imaging device according to claim 1;
a charge accumulation area electrically connected to the first electrode or the second electrode; and
a charge detection circuit electrically connected to the charge accumulation area.

7. The imaging device according to claim 1, wherein a carbon concentration in the electron blocking layer is in a range from 10 atom % to 35 atom %.

8. The imaging device according to claim 1, wherein the electron blocking layer is a $Cr_2O_3$ layer containing carbon.

9. The imaging device according to claim 8, wherein the electron blocking layer further includes chromium(II) oxide, chromium(IV) oxide, or chromium(VI) oxide.

10. The imaging device according to claim 1, wherein the electron blocking layer consists of the chromium oxide and carbon.

11. The imaging device according to claim 1, wherein the electron blocking layer is polycrystalline or amorphous.

12. The imaging device according to claim 1, wherein a thickness of the electron blocking layer is in a range from 5 nm to 100 nm.

13. A method for manufacturing an imaging device, where the imaging device includes a first electrode, a second electrode, a photoelectric conversion layer that is arranged between the first electrode and the second electrode, and an electron blocking layer that suppresses movement of electrons from the first electrode to the photoelectric conversion layer and is arranged between the first electrode and the photoelectric conversion layer; and the electron blocking layer is a chromium oxide layer and contains carbon, the manufacturing method comprising:
forming the electron blocking layer;
preparing an organic solution containing a photoelectric conversion material; and
forming the photoelectric conversion layer by applying the organic solution to the electron blocking layer.

14. The method for manufacturing an imaging device according to claim 13, wherein the electron blocking layer is formed by a metal organic compound decomposition method.

15. An imaging device comprising:
a first electrode;
a second electrode;
a photoelectric conversion layer that is arranged between the first electrode and the second electrode and converts light to charge; and
an electron blocking layer that suppresses movement of electrons from the first electrode to the photoelectric conversion layer, the electron blocking layer being a single layer containing carbon and an oxide of chromium and being arranged between the first electrode and the photoelectric conversion layer.

* * * * *